United States Patent
Gidney

(10) Patent No.: US 12,380,353 B2
(45) Date of Patent: *Aug. 5, 2025

(54) OBLIVIOUS CARRY RUNWAY REGISTERS FOR PERFORMING PIECEWISE ADDITIONS

(71) Applicant: Google LLC, Mountain View, CA (US)

(72) Inventor: Craig Gidney, Goleta, CA (US)

(73) Assignee: Google LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/745,923

(22) Filed: Jun. 17, 2024

(65) Prior Publication Data
US 2024/0338582 A1 Oct. 10, 2024

Related U.S. Application Data

(63) Continuation of application No. 18/207,108, filed on Jun. 7, 2023, now abandoned, which is a continuation
(Continued)

(51) Int. Cl.
*H04B 10/00* (2013.01)
*G06F 7/48* (2006.01)
(Continued)

(52) U.S. Cl.
CPC ........... *G06N 10/20* (2022.01); *G06F 7/4824* (2013.01); *G06F 7/505* (2013.01); *G06F 7/5057* (2013.01);
(Continued)

(58) Field of Classification Search
CPC ........ G06N 10/00; G06N 10/20; G06N 10/40; G06N 10/60; G06N 10/70; G06N 10/80
See application file for complete search history.

(56) References Cited

U.S. PATENT DOCUMENTS 3,249,745 A 5/1966 Burkhart
3,469,244 A 9/1969 Perotto et al.
(Continued)

FOREIGN PATENT DOCUMENTS

CN 1276939 12/2000
CN 108475346 8/2018
(Continued)

OTHER PUBLICATIONS

Alagic et al., "Status Report on the First Round of the NIST Post-Quantum Cryptography Standardization Process," Tech. Rep., National Institute of Standards and Technology, Jan. 2019, 27 pages.
(Continued)

*Primary Examiner* — Daniel G Dobson
(74) *Attorney, Agent, or Firm* — Fish & Richardson P.C.

(57) ABSTRACT

Methods and apparatus for piecewise addition into an accumulation register using one or more carry runway registers, where the accumulation register includes a first plurality of qubits with each qubit representing a respective bit of a first binary number and where each carry runway register includes multiple qubits representing a respective binary number. In one aspect, a method includes inserting the one or more carry runway registers into the accumulation register at respective predetermined qubit positions, respectively, of the accumulation register; initializing each qubit of each carry runway register in a plus state; applying one or more subtraction operations to the accumulation register, where each subtraction operation subtracts a state of a respective carry runway register from a corresponding portion of the accumulation register; and adding one or more input binary numbers into the accumulation register using piecewise addition.

20 Claims, 4 Drawing Sheets

Related U.S. Application Data of application No. 17/967,559, filed on Oct. 17, 2022, now Pat. No. 11,710,063, which is a continuation of application No. 16/833,339, filed on Mar. 27, 2020, now Pat. No. 11,475,348.

(60) Provisional application No. 62/826,142, filed on Mar. 29, 2019.

(51) Int. Cl.

| | | |
|---|---|---|
| *G06F 7/505* | (2006.01) | |
| *G06F 7/72* | (2006.01) | |
| *G06F 17/10* | (2006.01) | |
| *G06N 10/00* | (2022.01) | |
| *G06N 10/20* | (2022.01) | |
| *G06N 10/70* | (2022.01) | |
| *G11C 11/4063* | (2006.01) | |
| *H04B 10/70* | (2013.01) | |
| *H04J 14/00* | (2006.01) | |

(52) U.S. Cl.
CPC ............... *G06F 7/72* (2013.01); *G06F 17/10* (2013.01); *G06N 10/00* (2019.01); *G06N 10/70* (2022.01); *G11C 11/4063* (2013.01); *H04B 10/70* (2013.01)

(56) References Cited

U.S. PATENT DOCUMENTS

| | | | |
|---|---|---|---|
| 3,937,941 A | | 2/1976 | Zemel et al. |
| 11,475,348 B2* | | 10/2022 | Gidney .................. G06N 10/70 |
| 11,710,063 B2 | | 7/2023 | Gidney et al. |
| 2013/0246495 A1 | | 9/2013 | Svore et al. |
| 2013/0311531 A1 | | 11/2013 | Ahn et al. |
| 2018/0144262 A1* | | 5/2018 | Roetteler ............... G06N 10/70 |
| 2019/0378033 A1* | | 12/2019 | Figgatt .................. G06N 10/20 |

FOREIGN PATENT DOCUMENTS

| | | |
|---|---|---|
| CN | 109074518 | 12/2018 |
| FR | 1425811 | 1/1966 |
| TW | 201625925 | 7/2016 |

OTHER PUBLICATIONS

Apps.nsa.gov [online], "CNSA Suite and Quantum Computing FAQ," retrieved from URL <https://apps.nsa.gov/iaarchive/library/ia-guidance/ia-solutions-for-classified/algorithm-guidance/cnsa-suite-and-quantum-computing-faq.cfm>, Jan. 2016, 11 pages.

Babbush et al., "Encoding Electronic Spectra in Quantum Circuits with Linear T Complexity," Physical Review X, Oct. 2018, 041015-1-041015-36.

Barends et al., "Superconducting quantum circuits at the surface code threshold for fault tolerance," Nature, Apr. 2014, 508:500-503.

Beauregard, "Circuit for Shor's algorithm using 2n+3 qubits" CoRR, Submitted on May 2002, arXiv:quant-ph/0205095v1, 13 pages.

Berry et al., "Qubitization of Arbitrary Basis Quantum Chemistry by Low Rank Factorization" CoRR, Submitted on Feb. 2019, arXiv:1902.02134v1, 20 pages.

Bocharov et al., "Efficient Synthesis of Universal Repeat-Until-Success Circuits" CoRR, Submitted on Apr. 2014, arXiv:1404.5320v1, 16 pages.

Braithwaite, "Experimenting with Post-Quantum Cryptography," retrieved from URL <https://security.googleblog.com/2016/07/experimenting-with-post-quantum.html>, Jul. 2016, 5 pages.

Bravyi et al., "Universal quantum computation with ideal Clifford gates and noisy ancillas," Physical Review A, Feb. 2005, 71:022316-1-022316-14.

Buhler et al., "Factoring integers with the number field sieve," in The Development of the Number Field Sieve, Lecture Notes in Mathematics (LNM), 1993, 1554:50-94.

Campbell et al., "Applying quantum algorithms to constraint satisfaction problems," CoRR, Submited on Oct. 2018, arXiv:1810.05582v1, 26 pages.

Cuccaro et al., "A new quantum ripple-carry addition circuit," CoRR, Submitted on Oct. 2004, arXiv:quant-ph/0410184v1, 9 pages.

De Beaudrap et al., "The ZX calculus is a language for surface code lattice surgery," CoRR, Submitted on Apr. 2017, 1704.08670v1, 19 pages.

Diffie et al., "New Directions in Cryptography," IEEE Transactions on Information Theory, Nov. 1976, 22(6):644-654.

Draper et al., "A logarithmic-depth quantum carry-lookahead adder," CoRR, Submitted on Jun. 2004, arXiv:quant-ph/0406142, 21 pages.

Eastin, "Distilling one-qubit magic states into Toffoli states," Physical Review A, Mar. 2013, 87:032321-1-032321-7.

Ekera et al., "Quantum Algorithms for Computing Short Discrete Logarithms and Factoring RSA Integers," International Workshop on Post-Quantum Cryptography, Jun. 2017, 347-363.

Ekera, "Modifying Shor's algorithm to compute short discrete logarithms," retrieved from URL <https://eprint.iacr.org/2016/1128.pdf>, Dec. 2016, 26 pages.

Ekera, "On post-processing in the quantum algorithm for computing short discrete logarithms," retrieved from URL <https://eprint.iacr.org/2017/1122.pdf>, Feb. 2019, 19 pages.

Ekera, "Quantum algorithms for computing general discrete logarithms and orders with tradeoffs," retrieved from URL <https://eprint.iacr.org/2018/797.pdf>, Mar. 2020, 52 pages.

Ekera, "Revisiting Shor's quantum algorithm for computing general discrete logarithms," https://arxiv.org/abs/1905.09084, May 2019, 13 pages.

Fowler et al., "A bridge to lower overhead quantum computation," CoRR, Submitted on Sep. 2012, arXiv:1209.0510v1, 15 pages.

Fowler et al., "Low overhead quantum computation using lattice surgery," CoRR, Submitted on Aug. 2018, arXiv:1808.06709v1, 15 pages.

Fowler et al., "Surface codes: Towards practical large-scale quantum computation," Physical Review A, Sep. 2012, 86:032324-1-032324-48.

Fowler et al., "Surface code implementation of block code state distillation," Scientific Reports, Jun. 2013, 3(1939): 1-6.

Fowler, "Time-optimal quantum computation," CoRR, Submitted on Oct. 2012, arXiv:1210.4626v1, 5 pages.

Gheorghiu et al., "Quantum cryptanalysis of symmetric, public-key and hash-based cryptographic schemes," CoRR, Submitted on Feb. 2019, arXiv:1902.02332v1, 19 pages.

Gidney et al., "Efficient magic state factories with a catalyzed |CCZ> to 2|T> transformation," CoRR, Submitted on Dec. 2018, arXiv:1812.01238v1, 24 pages.

Gidney et al., "How to factor 2048 bit RSA integers in 7 hours using 23 million noisy qubits," https://arxiv.org/abs/1905.09749, last revised Dec. 2019, 26 pages.

Gidney et al., "How to factor 2048 bit RSA integers in 7 hours using 23 million noisy qubits," CoRR, Submitted on May 2019, arXiv:1905.09749v1, 25 pages.

Gidney et al., "Efficient magic state factories with a catalyzed |CCZ> to 2|T> transformation," CoRR, Submitted on Apr. 2019, arXiv:1812.01238v3, 24 pages.

Gidney et al., "Flexible layout of surface code computations using AutoCCZ states," CoRR, Submitted on May 2019, arXiv:1905.08916v1, 17 pages.

Gidney, "Factoring with n+2 clean qubits and n-1 dirty qubits," CoRR, Submitted on Jun. 2017, arXiv:1706.07884v1, 13 pages.

Gidney, "Halving the cost of quantum addition," Quantum 2, Jun. 2018, 6 pages.

Gidney, "Approximate encoded permutations and piecewise quantum adders," CoRR, Submitted on May 2019, arXiv:1905.08488v1, 15 pages.

Gidney, "Asymptotically Efficient Quantum Karatsuba Multiplication," CoRR, Submitted on Apr. 2019, arXiv:1904.07356v1, 11 pages.

(56) References Cited

OTHER PUBLICATIONS

Gidney, "Windowed quantum arithmetic," CoRR, Submitted on May 2019, arXiv:1905.07682v1, 11 pages.
Gillmor, "RFC 7919: Negotiated Finite Field Diffie-Hellman Ephemeral Parameters for Transport Layer Security (TLS)," retrieved from URL <https://www.hjp.at/doc/rfc/rfc7919.html>, Aug. 2016, 30 pages.
Github.com [online], "OpenSSL Software Foundation, Openssl source code: Line 32 of apps/dhparam.c," retrieved from URL <https://github.com/openssl/openssl/blob/07f434441e7ea385f975e8df8caa03e62222ca61/apps/dhparam.c#L32>, Dec. 2018, 6 pages.
Github.com [online], "Quirk: A drag-and-drop quantum circuit simulator for exploring small quantum circuits," available on or before Jun. 11, 2018, via Internet Archive: Wayback Machine URL <https://web.archive.org/web/20180611035822/https://github.com/Strilanc/Quirk>, retrieved on Jun. 30, 2020, URL <https://github.com/Strilanc/Quirk>, 3 pages.
Gnupg.org [online], "GnuPG frequently asked questions—11.2 Why Does GnuPG Default to 2048 bit RSA-2048?" available on or before Jul. 1, 2016, via Internet Archive: Wayback Machine URL <https://web.archive.org/web/20160701194147/https://www.gnupg.org/faq/gnupg-faq.html#default_rsa2048>, retrieved on Jun. 29, 2020, URL <https://www.gnupg.org/faq/gnupg-faq.html#default_rsa2048>, 22 pages.
Gordon, "Discrete logarithms in GF(p) using the Number Field Sieve," SIAM Journal on Discrete Mathematics, 1993, 6:124-138.
Gottesman et al., "Demonstrating the viability of universal quantum computation using teleportation and single-qubit operations," Nature, Nov. 1999, 402:390-393.
Gottesman, "The Heisenberg Representation of Quantum Computers," CoRR, Submitted on Jul. 1998, arXiv:quant-ph/9807006v1, 20 pages.
Griffiths et al., "Semiclassical Fourier Transform for Quantum Computation," Physical Review Letters, Apr. 1996, 76(17):3228-3231.
Haah et al., "Codes and Protocols for Distilling T, controlled-S, and Toffoli Gates," CoRR, Submitted on May 2018, arXiv:1709.02832v3, 29 pages.
Haner et al., "Factoring using 2n+2 qubits with Toffoli based modular multiplication," CoRR, Submitted on Nov. 2016, arXiv:1611.07995v1, 7 pages.
Hastings et al., "Reduced Space-Time and Time Costs Using Dislocation Codes and Arbitrary Ancillas," CoRR, Submitted on Aug. 2014, arXiv:1408.3379v1, 16 pages.
Horsman et al., "Surface code quantum computing by lattice surgery," New Journal of Physics, Dec. 2012, 28 pages.
International Preliminary Report on Patentability in International Appln. No. PCT/US2020/025466, mailed on Oct. 14, 2021, 12 pages.
International Search Report and Written Opinion in International Appln. No. PCT/US2020/025466, mailed on Jul. 22, 2020, 18 pages.
Jeandel et al., "A Complete Axiomatisation of the ZX-Calculus for Clifford+T Quantum Mechanics," Proceedings of the 33rd Annual ACM/IEEE Symposium on Logic in Computer Science, Jul. 2018, 10 pages.
Jones, "Low-overhead constructions for the fault-tolerant Toffoli gate," Physical Review A, Feb. 2013, 022328-1-022328-4.
Karatsuba et al., "Multiplication of many-digital numbers by automatic computers," Doklady Akademii Nauk, Russian Academy of Sciences, Feb. 1962, 145(2):293-294 (with English translation).
Keylength.com [online], "BlueKrypt—Cryptographic Key Length Recommendation," available on or before Mar. 3, 2019, via Internet Archive: Wayback Machine URL <https://web.archive.org/web/20190303042857/https://www.keylength.com/>, retrieved on Jun. 29, 2020, URL <https://www.keylength.com>, 1 page.
Kim et al., "Flipping bits in memory without accessing them: An experimental study of DRAM disturbance errors," 2014 ACM/IEEE 41st International Symposium on Computer Architecture (ISCA), Jun. 2014, 12 pages.
Kitaev, "Fault-tolerant quantum computation by anyons," Annals of Physics, Jan. 2003, 303(1):2-30.
Kivinen et al., "RFC 3526: More Modular Exponentiation (MODP) Diffie-Hellman groups for Internet Key Exchange (IKE)," retrieved from URL <https://www.hjp.at/doc/rfc/rfc3526.html>, May 2003, 11 pages.
Kleinjung et al., "Factorization of a 768-Bit RSA Modulus," Lecture Notes in Computer Science: Advanced in Cryptology: CRYPTO 2010, 2010, 6223:333-350.
Lenstra et al., "Selecting Cryptographic Key Sizes," Journal of Cryptology, 2001, 14:225-293.
Lenstra et al., "The number field sieve," Proceedings of the 22nd Annual ACM Symposium on the Theory of Computing (STOC), 1990, 564-572.
Lenstra, "Key Lengths," The Handbook of Information Security, retrieved from URL <http://citeseerx.ist.psu.edu/viewdoc/download;jsessionid=F4B43E1DEB9BD699C0F03EA08A2AD810?doi=10.1.1.694.8206&rep=rep1&type=pdf>, 2004, 32 pages.
Li, "A magic state's fidelity can be superior to the operations that created it," New Journal of Physics, Feb. 2015, 17:1-7.
Linux.die.net [online], "ssh-keygen(1)—Linux man page," available on or before Mar. 25, 2018, via Internet Archive: Wayback Machine URL <https://web.archive.org/web/20180325042106/https://linux.die.net/man/1/ssh-keygen>, retrieved on Jun. 29, 2020, URL <https://linux.die.net/man/1/ssh-keygen>, 3 pages.
Listserv.nodak.edu [online], "795-bit factoring and discrete logarithms," retrieved from URL <https://listserv.nodak.edu/cgi-bin/wa.exe?A2=NMBRTHRY;fd743373.1912&FT=M&P=T&H=&S=>, Dec. 2, 2019, 2 pages.
Litinski, "A Game of Surface Codes: Large-Scale Quantum Computing with Lattice Surgery," CoRR, Submitted on Aug. 2018, arXiv:1808.02892v1, 35 pages.
Litinski, "Magic State Distillation: Not as Costly as You Think," CoRR, Submitted on May 2019, arXiv:1905.06903v1, 20 pages.
Low et al., "Trading T-gates for dirty qubits in state preparation and unitary synthesis," CoRR, Submitted on Dec. 2018, arXiv:1812.00954v1, 11 pages.
Masini et al., "Qualitative Modal Representation of Quantum Register Transformations (extended version)" CoRR, Submitted on Mar. 2008, arXiv:0802.4057v2, 15 pages.
Mosca et al., "The Hidden Subgroup Problem and Eigenvalue Estimation on a Quantum Computer," Proceeding from the First NASA International Conference: Quantum Computing and Quantum Communications (QCQC1998), May 1999, 1509:174-188.
Mosca, "Cybersecurity in an Era with Quantum Computers: Will We Be Ready?" IEEE Security & Privacy, Oct. 2018, 16(5): 38-41.
NIST and CCCS, "Implementation Guidance for FIPS 140-2 and the Cryptographic Module Validation Program," retrieved from URL <https://web.archive.org/web/20190313055345/https://csrc.nist.gov/csrc/media/projects/cryptographic-module-validation-program/documents/fips140-2/fips1402ig.pdf, Feb. 5, 2019, 240 pages.
NIST, "Recommendation for Key Management, Part 1: General (SP 800-57 Part 1 Rev. 4)," retrieved from URL <https://nvlpubs.nist.gov/nistpubs/SpecialPublications/NIST.SP.800-57pt1r4.pdf>, Jan. 2016, 161 pages.
NIST, "Recommendation for Pair-Wise Key-Establishment Schemes Using Discrete Logarithm Cryptography (SP 800-56A Rev. 3)," retrieved from URL <https://nvlpubs.nist.gov/nistpubs/SpecialPublications/NIST.SP.800-56Ar3.pdf>, Apr. 2018, 152 pages.
NIST, "Digital Signature Standard (DSS) (FIPS PUB 186-4)," retrieved from URL <https://nvlpubs.nist.gov/nistpubs/FIPS/NIST.FIPS.186-4.pdf>, Jul. 2013, 130 pages.
Notice of Allowance in Australian Appln. No. 2023202870, mailed on Sep. 21, 2023, 3 pages.
Notice of Allowance in Chinese Appln. No. 202080024944.6, mailed on Jun. 20, 2024, 7 pages (with English translation).
Office Action in Australian Appln. No. 2023202870, mailed on Aug. 28, 2023, 3 pages.
Office Action in Canadian Appln. No. 3,135,493, mailed on Nov. 21, 2022, 5 pages.
Office Action in Chinese Appln. No. 202080024944.6, mailed on Feb. 1, 2024, 24 pages (with English translation).

(56) References Cited

OTHER PUBLICATIONS

O'Gorman et al., "Quantum computation with realistic magic-state factories," Physical Review A, Mar. 2017, 032338-1-032338-19.
Parent et al., "Improved reversible and quantum circuits for Karatsuba-based integer multiplication," CoRR, Submitted on Jun. 2017, arXiv:1706.03419v1, 16 pages.
Parker et al., "Efficient Factorization with a Single Pure Qubit and log N Mixed Qubits," Physical Review Letters, Oct. 2000, 85(14):3049-3052.
Pohlig et al., "An Improved Algorithm for Computing Logarithms over GF(p) and Its Cryptographic Significance," IEEE Transactions on Information Theory, Jan. 1978, 24(1): 106-110.
Pollard, "Factoring with cubic integers," Lecture Notes in Mathematics: The Development of the Number Field Sieve, Oct. 2006, 4-10.
Pollard, "Monte Carlo Methods for Index Computation (mod p)," Mathematics of Computation, Jul. 1978, 32(143):918-924.
Pollard, "The lattice sieve," The Development of the Number Field Sieve, Lecture Notes in Mathematics (LNM), 1993, 1554:43-49.
Pomerance, "A Tale of Two Sieves," Notices of the AMS, Dec. 1996, 43(12):1473-1485.
Raussendorf et al., "A fault-tolerant one-way quantum computer," Annals of Physics, Sep. 2006, 321(9):2242-2270.
Raussendorf et al., "Fault-Tolerant Quantum Computation with High Threshold in Two Dimensions," Physical Review Letters 98, May 2007, 190504-1-190504-4.
Rivest et al., "A method for obtaining digital signatures and public-key cryptosystems," Communications of the ACM, Feb. 1978, 21(2):120-126.
Roetteler et al., "Quantum Resource Estimates for Computing Elliptic Curve Discrete Logarithms," Proceedings of the 23rd International Conference on the Theory and Application of Cryptology and Information Security: Advances in Cryptology (AsiaCrypt 2017), Lecture Notes in Computer Science (LNCS), Nov. 2017, 10625:241-270.
Schirokauer, "Discrete Logarithms and Local Units," Philosophical Transactions of the Royal Society A, Nov. 1993, 345(1676):409-423.
Schonhage et al., "Schnelle Multiplikation großer Zahlen," Computing 7, Sep. 1971, 281-292 (with English summary).
Schroeder et al., "DRAM Errors in the Wild: A Large-Scale Field Study," ACM Sigmetrics Performance Evaluation Review, Jun. 2009, 37, 193-204.
Shor, "Algorithms for quantum computation: Discrete logarithms and factoring," Proceedings 35th Annual Symposium on Foundations of Computer Science, Nov. 1994, 124-134.
Smartcardfocus.com [online], "JavaCOS A22 dual interface Java card—150K," available on or before Dec. 18, 2016, via Internet Archive: Wayback Machine URL <https://web.archive.org/web/20161218155914/http://www.smartcardfocus.com/shop/ilp/id~712/javacos-a22-dual-interface-java-card-150k/p/index.shtml>, retrieved on Jun. 29, 2020, URL <https://www.smartcardfocus.com/shop/ilp/id~712/javacos-a22-dual-interface-java-card-150k/p/index.shtml>, 1 page.
Van Meter et al., "Fast quantum modular exponentiation," Physical Review A, May 2005, 71:052320-1-052320-12.
Van Oorschot et al., "On Diffie-Hellman Key Agreement with Short Exponents," Proceedings of the International Conference on the Theory and Applications of Cryptographic Techniques, Advanced in Cryptology (Eurocrypt 1996), 1996, 1070:332-343.
Vedral et al., "Quantum networks for elementary arithmetic operations," Physical Review A, Jul. 1996, 147-153.
Wei, "Embedded Software Design and Implementation for Satellite-Borne Quantum Communication Experiment System" China's Master's Degree Thesis Information and Technology (IT), University of Ningbo University, Apr. 15, 2014, 80 pages (with English abstract).
Wikipedia.org [online], "Timeline of quantum computing," available on or before Nov. 19, 2018, via Internet Archive: Wayback Machine URL <https://web.archive.org/web/20181119015658/https://en.wikipedia.org/wiki/Timeline_of_quantum_computing>, retrieved on Jun. 30, 2020, URL <https://en.wikipedia.org/wiki/Timeline_of_quantum_computing>, 13 pages.
Zalka, "Fast versions of Shor's quantum factoring algorithm," CoRR, Submitted on Jun. 1998, arXiv:quant-ph/9806084v1, 37 pages.
Zalka, "Shor's algorithm with fewer (pure) qubits," CoRR, Submitted on Jan. 2006, arXiv:quant-ph/0601097v1, 12 pages.
Office Action in Australian Appln. No. 2023274198, mailed on Nov. 18, 2024, 2 pages.

* cited by examiner

```
                              200

┌─────────────────────────────────────────────────────────┐
    │  Insert the one or more carry runway registers into the │
    │  accumulation register at respective predetermined qubit│
    │       positions in the accumulation register            │
    │                                                     202 │
    └─────────────────────────────────────────────────────────┘
                              │
                              ▼
    ┌─────────────────────────────────────────────────────────┐
    │  Initialize each qubit in each carry runway register in a plus │
    │                          state                          │
    │                                                     204 │
    └─────────────────────────────────────────────────────────┘
                              │
                              ▼
    ┌─────────────────────────────────────────────────────────┐
    │   Apply multiple subtraction operations to accumulation │
    │                        register                         │
    │                                                     206 │
    └─────────────────────────────────────────────────────────┘
                              │
                              ▼
    ┌─────────────────────────────────────────────────────────┐
    │   Add one or more input binary numbers into the         │
    │   accumulation register using piecewise addition        │
    │                                                     208 │
    └─────────────────────────────────────────────────────────┘
```

FIG. 2

OBLIVIOUS CARRY RUNWAY REGISTERS FOR PERFORMING PIECEWISE ADDITIONS

CROSS-REFERENCE TO RELATED APPLICATIONS

This application is a continuation of U.S. patent application Ser. No. 18/207,108, filed Jun. 7, 2023, which is a continuation of U.S. patent application Ser. No. 17/967,559, filed Oct. 17, 2022, now U.S. Pat. No. 11,710,063, which is a continuation of U.S. patent application Ser. No. 16/833,339, filed Mar. 27, 2020, now U.S. Pat. No. 11,475,348, which claims the benefit of the filing date of U.S. Provisional Application No. 62/826,142, filed Mar. 29, 2019. The disclosure of the prior applications are considered part of and are incorporated by reference in the disclosure of this application.

BACKGROUND

This specification relates to quantum computing.

Classical computers have memories made up of bits, where each bit can represent either a zero or a one. Quantum computers maintain sequences of quantum bits, called qubits, where each quantum bit can represent a zero, one or any quantum superposition of zeros and ones. Quantum computers operate by setting qubits in an initial state and controlling the qubits, e.g., according to a sequence of quantum logic gates.

SUMMARY

This specification describes techniques for performing piecewise additions using oblivious carry runway registers.

In general, one innovative aspect of the subject matter described in this specification can be implemented in a method for piecewise addition into an accumulation register using one or more carry runway registers, wherein the accumulation register comprises a first plurality of qubits with each qubit representing a respective bit of a first binary number, and wherein each carry runway register comprises multiple qubits representing a respective binary number, the method comprising: inserting the one or more carry runway registers into the accumulation register at respective predetermined qubit positions, respectively, of the accumulation register; initializing each qubit of each carry runway register in a plus state; applying one or more subtraction operations to the accumulation register, wherein each subtraction operation subtracts a state of a respective carry runway register from a portion of the accumulation register that begins at the predetermined qubit position where the respective initialized carry runway register was inserted and ends at a qubit position prior to a next inserted carry runway or a most significant bit of the first binary number; and adding one or more input binary numbers into the accumulation register using piecewise addition.

Other implementations of these aspects includes corresponding computer systems, apparatus, and computer programs recorded on one or more computer storage devices, each configured to perform the actions of the methods. A system of one or more classical and/or quantum computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations adding one or more input binary numbers into the accumulation register using piecewise addition comprises: separating the input binary numbers into pieces corresponding to portions of the accumulation register in between each carry runway register, and performing a respective addition operation for each corresponding piece of an input binary number to add the piece of the input binary number to a state of a respective accumulation register portion, wherein carries of the addition operations are added to states of respective carry runway registers.

In some implementations inserting the one or more carry runway registers into the accumulation register at respective predetermined qubit positions of the accumulation register comprises inserting a predetermined number of carry runway registers at evenly spaced intervals.

In some implementations subtracting a state of a respective carry runway register from a portion of the accumulation register that begins at the predetermined qubit position where the respective initialized carry runway register was inserted and ends at a qubit position prior to a next inserted carry runway or a most significant bit of the first binary number comprises: subtracting a value encoded in the state of the carry runway register from a value of the state of the portion of the accumulation register, and updating the state of the portion of the accumulation register to encode a new value.

In some implementations the method further comprises adding states of the one or more carry runway registers to the respective portions of the accumulation register; and measuring the accumulation register to determine a result of the addition of the one or more input binary numbers.

In some implementations the method further comprises determining whether each qubit in each of the one or more carry runway registers were correctly initialized.

In some implementations the method further comprises measuring the accumulation register and the one or more carry runway registers; and removing, by classical processing, the states of the one or more carry runway registers from the state of the accumulation register to determine a result of the piecewise addition.

In some implementations addition operations for pieces of a same input binary number are performed in parallel.

In some implementations each qubit in the first plurality of qubits represents a respective bit of a first binary number stored in little endian 2s complement integer format, each qubit in a respective carry runway register represents a respective binary number stored in little endian 2s complement integer format.

In some implementations the addition operations comprise 2s complement addition operations.

In some implementations the addition operations comprise modular addition operations.

The subject matter described in this specification can be implemented in particular ways so as to realize one or more of the following advantages.

A system implementing the presently described carry runways can perform addition computations with increased computational speed, since the carry runways encode an addition operation into multiple piecewise addition operations that can be performed in parallel.

In addition, a system implementing the presently described carry runways can perform addition computations with target accuracy. Generally, errors in an addition operation can occur if a runway overflows. In the presently described carry runway construction, this can only occur when the carry runway stores $2^m-1$ (where m represents the size of the carry runway) and gets incremented, and an addition can only increment the runway once. Since only one of the $2^m$ possible runway values deviates, the result of the piecewise addition operations deviates from the result of the addition operation by at most $\frac{1}{2}m$. Accordingly, increasing the carry runway size reduces the deviation. Further, the presently described carry runway techniques can be used to perform an addition on a modular integer represented using a coset representation of modular integers with r carry runways with deviation at most $(r+1)/2^m$.

The presently described carry runway techniques can be applied in any quantum computation that involves counting or accumulation. Because of the above described parallelization and bounded deviation, quantum computations implementing the presently described carry runways can therefore also achieve improved computational speed and error rates.

The details of one or more implementations of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

FIG. 2 is a flow diagram of an example process for piecewise addition into an accumulation register using one or more carry runway registers.

Like reference numbers and designations in the various drawings indicate like elements.

DETAILED DESCRIPTION

Overview

When performing additions, knowing that a carry cannot occur at a particular location can be advantageous. For example, a known classical optimization technique when many modular additions are to be performed is to purposefully append additional bits-referred to herein as a carry runway—to a register. This allows many additions targeting the register to be performed before it is necessary to normalize the register back into the [0, N) range due to the risk of an overflow. Carry runways can also be introduced in the middle of registers, allowing the two halves to be worked on independently for some time.

Carry runways are non-trivial to implement in a quantum computing context because they cause decoherence. For example, consider a 2-bit register with a carry runway at position 1, where the register is initially in the |0⟩ state. To add 2 to the register, either 1 can be added to the register twice or 2 can be added to the register once. Either addition operation could be performed conditioned on an ancilla qubit q. Because 1+1=2, it is expected that both possible addition operations will have equivalent effects and that the register will not become entangled with q. However, because the lower half (most significant part) of the register carries into the runway, it can be determined which addition operation was performed by checking (via measurement) whether the set bit is in the runway or the higher half (least significant part). This results in q incorrectly becoming entangled with the register. To avoid this problem, the carry runway should be oblivious to the addition operation that was performed.

This specification describes new carry runway constructions for encoding addition operations into multiple piecewise addition operations. Addition operations performed using the carry runway construction cannot be distinguished based on post processing analysis. The carry runway constructions are therefore referred to herein as oblivious carry runways. If an attacker is given an intermediate state of an oblivious carry runway computation (in between two additions), the amount of information they can infer (in addition to what they would be able to infer from the intermediate state of a computation without carry runways) is provably bounded to be exponentially small in the length of runway (assuming the runways were initialized to random states unknown to the attacker). This implies that in the quantum case the computation will remain coherent and therefore information theoretic security is preserved.

Example Hardware

Figure 1:
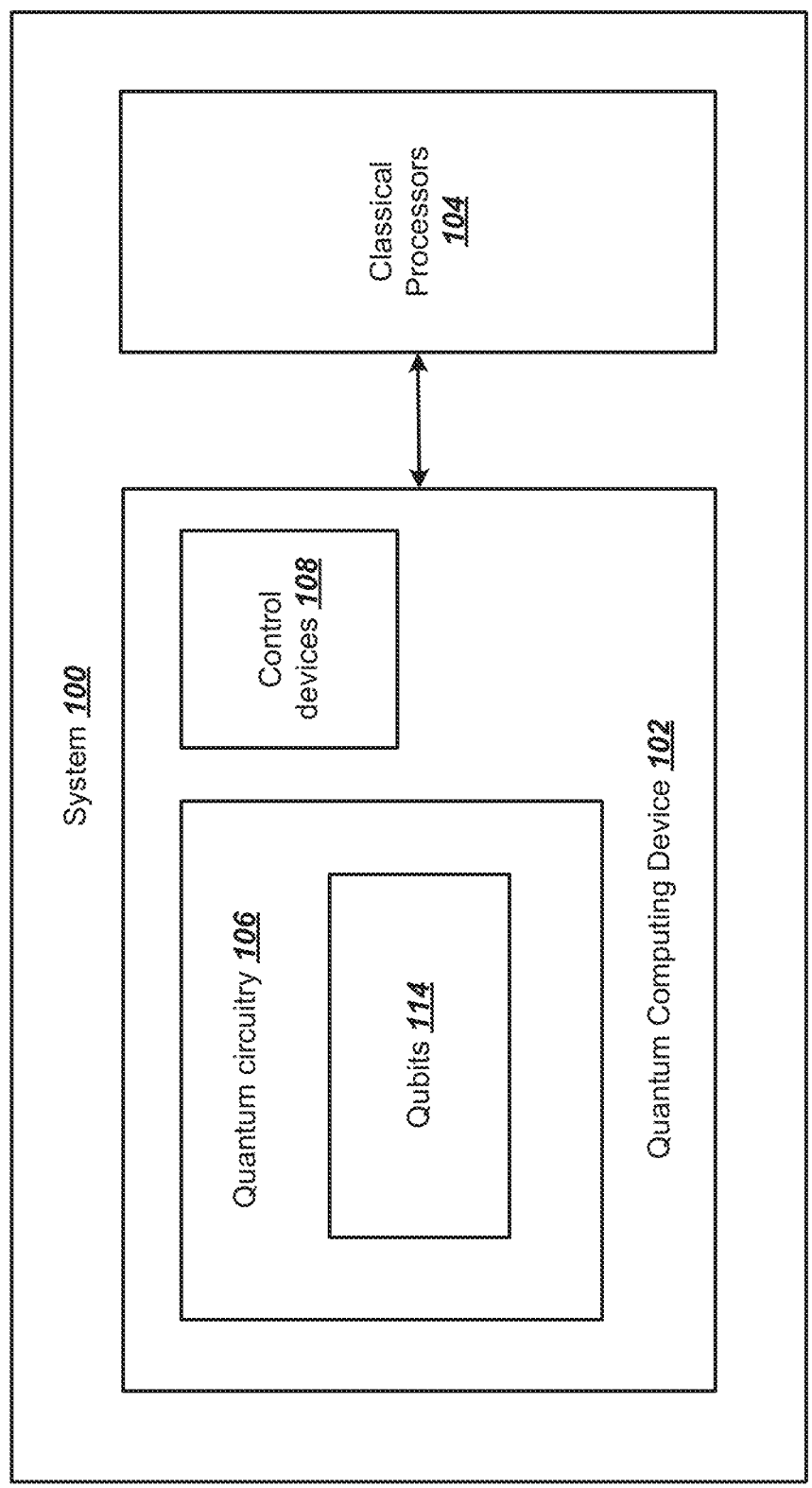
FIG. 1 shows an example quantum computation system.

FIG. 1 depicts an example quantum computation system 100. The system 100 is an example of a system implemented as quantum and classical computer programs on one or more quantum computing devices and classical computers in one or more locations, in which the systems, components, and techniques described below can be implemented.

The system 100 includes a quantum computing device 102 in data communication with one or more classical processors 104. For convenience, the quantum computing device 102 and classical processors 104 are illustrated as separate entities, however in some implementations the classical processors 104 may be included in the quantum computing device 102.

The quantum computing device 102 includes components for performing quantum computation. For example, the quantum computing device 102 includes quantum circuitry 106 and control devices 108.

The quantum circuitry 106 includes components for performing quantum computations, e.g., components for implementing the various quantum circuits and operations described in this specification. For example, the quantum circuitry may include a quantum system that includes one or more multi-level quantum subsystems, e.g., qubits 114. The qubits 114 are physical qubits that may be used to perform algorithmic operations or quantum computations. The specific realization of the one or more qubits and their interactions may depend on a variety of factors including the type of quantum computations that the quantum computing device 102 is performing. For example, the qubits may include qubits that are realized via atomic, molecular or solid-state quantum systems. In other examples the qubits may include, but are not limited to, superconducting qubits, e.g., Gmon or Xmon qubits, or semi-conducting qubits. Further examples of realizations of multi-level quantum subsystems include fluxmon qubits, silicon quantum dots or phosphorus impurity qubits. In some cases the quantum circuitry may further include one or more resonators attached to one or more superconducting qubits. In other cases ion traps, photonic devices or superconducting cavities (with which states may be prepared without requiring qubits) may be used.

In this specification, the term "quantum circuit" is used to refer to a sequence of quantum logic operations that can be applied to a qubit register to perform a respective computation. Quantum circuits comprising different quantum logic operations, e.g., single qubit gates, multi-qubit gates, etc., may be constructed using the quantum circuitry 106. Constructed quantum circuits can be operated/implemented using the control devices 108.

The type of control devices 108 included in the quantum system depend on the type of qubits included in the quantum computing device. For example, in some cases the multiple qubits can be frequency tunable. That is, each qubit may have associated operating frequencies that can be adjusted using one or more control devices. Example operating frequencies include qubit idling frequencies, qubit interaction frequencies, and qubit readout frequencies. Different frequencies correspond to different operations that the qubit can perform. For example, setting the operating frequency to a corresponding idling frequency may put the qubit into a state where it does not strongly interact with other qubits, and where it may be used to perform single-qubit operations/gates. In these examples the control devices 108 may include devices that control the frequencies of qubits included in the quantum circuitry 106, an excitation pulse generator and control lines that couple the qubits to the excitation pulse generator. The control devices may then cause the frequency of each qubit to be adjusted towards or away from a quantum gate frequency of an excitation pulse on a corresponding control driveline.

The control devices 108 may further include measurement devices, e.g., readout resonators. Measurement results obtained via measurement devices may be provided to the classical processors 104 for processing and analyzing. Measurement devices perform physical measurements on properties of the qubits, either directly or indirectly, from which the state(s) of the qubits can be inferred.

Programming the Hardware: Performing Addition Operations Using Oblivious Carry Runways FIG. 2 is a flow diagram of an example process 200 for piecewise addition into an accumulation register using one or more carry runway registers. For convenience, the process 200 will be described as being performed by a system of one or more classical or quantum computing devices located in one or more locations. For example, a quantum computation system, e.g., the system 100 of FIG. 1, appropriately programmed in accordance with this specification, can perform the process 200. The process 200 can be performed as a sub routine of any quantum algorithm/computation that that involves counting or accumulation.

The accumulation register includes a first number n of qubits. Each qubit in the accumulation register represents a respective bit of a first binary number, so that the state of the accumulation register represents the first binary number, e.g., in little endian 2's complement integer format. The first number of qubits can be ordered according to increasing bit significance. For example, a first (low) qubit in the accumulation register can correspond to a least significant bit of the first binary number, and a last (high) qubit in the accumulation register can correspond to a most significant bit of the first binary number.

Each carry runway register includes a respective number of qubits. In some implementations each carry runway register may include a same number m of qubits. Each qubit in each carry runway register represents a respective bit of a respective binary number, so that the state of each carry runway register represents a respective binary number, e.g., in little endian 2's complement integer format.

The system inserts the one or more carry runway registers into the accumulation register at respective predetermined qubit positions of the accumulation register (step 202). For example, the system may lengthen the size of the accumulation register (i.e., increase the total number of qubits) then designate sections of the lengthened register for different purposes, e.g., accumulation register portions and carry runway register portions. In this example, the lengthened register may not be operated on as if it were a normal integer register and during operation, pieces of the piecewise additions are added into the correct corresponding piece and carry into the appropriate runway.

In some implementations a predetermined number of carry runway registers can be inserted at evenly spaced intervals in the accumulation register. That is, for an accumulation register of length n, a carry runway register of length m can be inserted at each qubit position of the accumulation register that is a multiple of s, but not within s qubit positions of the end of the accumulation register. The accumulation register will therefore have $r=\lceil n/s-1 \rceil$ carry runway registers in total. The runway length m may be at least logarithmic in the number carries that occur, i.e. the number of pieces s times the number of additions A. In practice the number of additions A may be polynomial in the problem size n and the register size can also be polynomial in n. This means that m can be at least logarithmic in length, with respect to n.

Figure 3A:
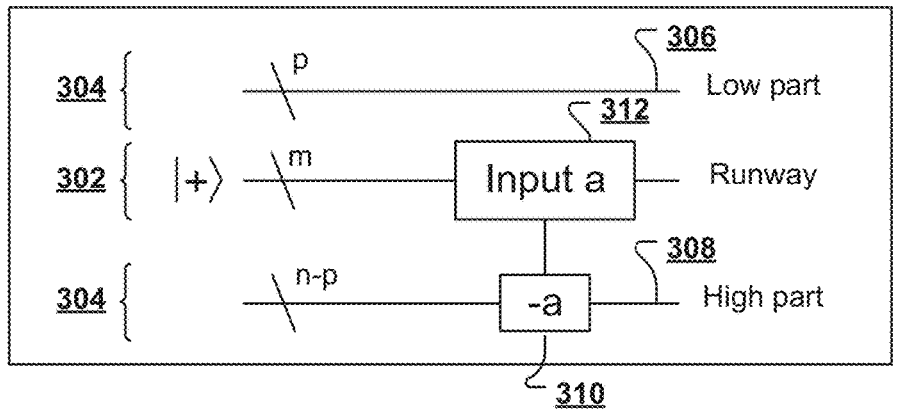
FIG. 3A shows an example circuit diagram for adding one carry runway register to an accumulation register.

FIG. 3A shows an example circuit diagram 300 for adding a carry runway register to an accumulation register. In the circuit diagram 300, a carry runway register 302 of length m is added at bit position p to an accumulation register 304 of size n. The low part 306 of the accumulation register includes p qubits. The high part 308 of the accumulation register includes n–p qubits. The low part 306 of the accumulation register corresponds to lesser significant bits of the first binary number compared to the high part 308 of the accumulation register, which corresponds to more significant bits of the first binary number. Each qubit in the carry runway register 302 is initialized in a plus state, as described below with reference to step 204 of example process 200.

Figure 3B:
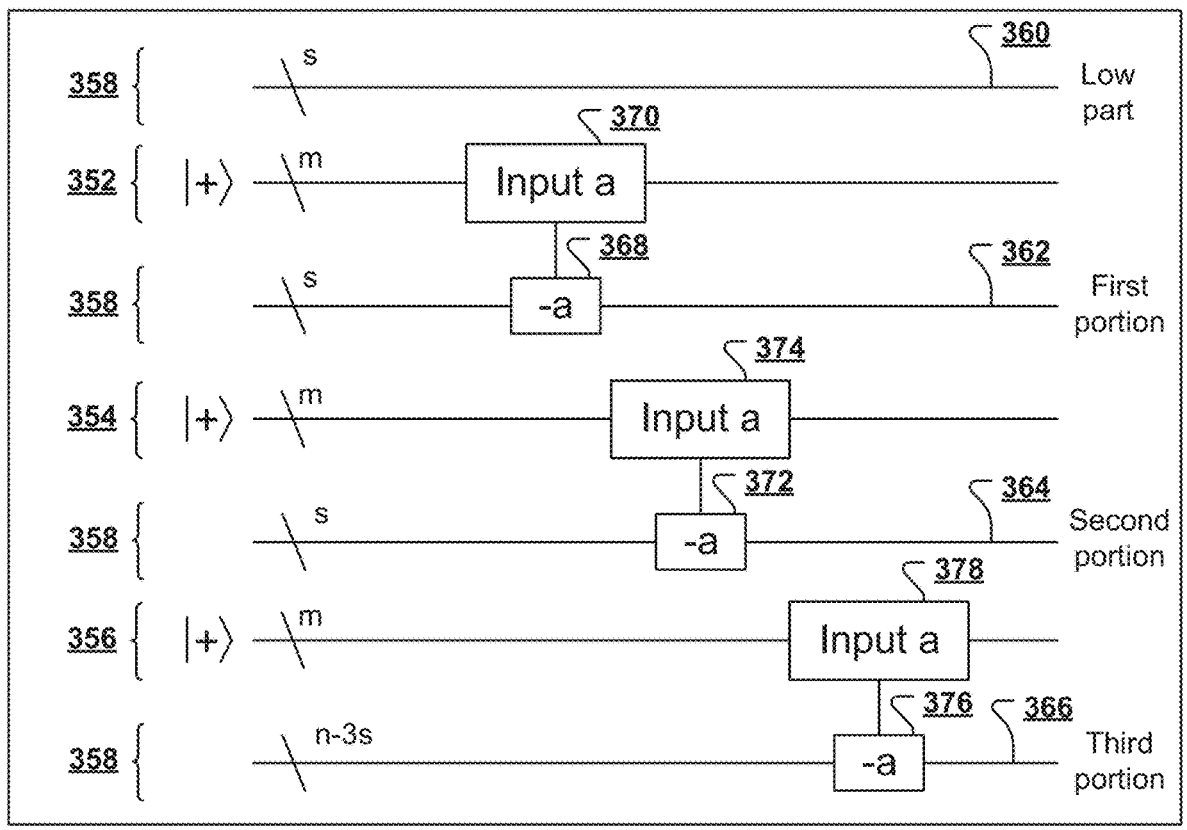
FIG. 3B shows an example circuit diagram for adding multiple carry runway registers to an accumulation register.

FIG. 3B shows an example circuit diagram 350 for adding multiple carry runway registers to an accumulation register. In the circuit diagram 350, three carry runway registers 352, 354, 356 are added to an accumulation register 358 of size n at evenly spaced intervals. Each carry runway register 352-356 include s qubits. Each qubit in each carry runway register is initialized in a plus state, as described below with reference to step 204 of example process 200.

The first carry runway register 352 is added to the accumulation register 358 at bit position s to the accumulation register. The second carry runway register 354 is added at bit position 2s. The third carry runway register 356 is added at bit position 3s.

After adding the three carry runway registers 352-356, the accumulation register 358 is divided into multiple portions 360-366. Portion 360 represents the low part of the accumulation register that corresponds to the s least significant bits of the first binary number. Portion 362 represents a first portion that begins after the qubit position s where the first carry runway register 352 has been inserted and ends at the qubit position prior to the position where the second carry runway register 354 has been inserted, i.e., qubit position 2s. Portion 364 represents a second portion that begins after the qubit position 2s where the second carry runway register 354 has been inserted and ends at the qubit position prior to the position where the third carry runway register 356 has been inserted, i.e., qubit position 3s. Portion 366 represents a third portion that begins after the qubit position 3s where the third carry runway register 356 has been inserted and ends at the most significant bit of the first binary number. Because the third portion 366 is the last portion of the accumulation register, it will include [n−3s] qubits.

Returning to FIG. 2, the system initializes each qubit of each carry runway register in a plus state (step 204).

The system applies one or more subtraction operations to the accumulation register (step 206). Each subtraction operation subtracts a state of a respective carry runway register from a portion of the accumulation register that begins at the predetermined qubit position where the respective initialized carry runway register was inserted and ends at a qubit position prior to a next inserted carry runway or a most significant bit of the first binary number. Subtracting a state of a respective carry runway register from a portion of the accumulation register can include subtracting a value encoded in the state of the runway from the value of the state of the portion of the accumulation register, and updating the state of the portion of the accumulation register so that it encodes the new value. This may be performed by subtracting the carry runway register multiplied by 2k from the whole accumulation register, where k is the predetermined qubit position. In effect this means that the first k qubits of the accumulation register can be ignored, pretending that the accumulation register started on the qubit at position k (i.e. that position k was really position 0) when performing the subtraction.

For example, as shown in FIG. 3A, in implementations where one carry runway register 302 is inserted into the accumulation register 304, the system applies one subtraction operation 310 to the accumulation register 304. The subtraction operation 310 subtracts a state 312 of the carry runway register 302 from the high part 308 of the accumulation register.

As another example, as shown in FIG. 3B, in implementations where multiple carry runway registers 352-356 are inserted into the accumulation register 358, the system applies multiple subtraction operations 368, 372, 376 to the accumulation register 358 (where the number of subtraction operations is equal to the number of inserted carry runway registers.) The first subtraction operation 368 subtracts a state 370 of the first carry runway register 352 from the first portion 362 of the accumulation register 358. The second subtraction operation 372 subtracts a state 374 of the second carry runway register 354 from the second portion 364 of the accumulation register 358. The third subtraction operation 376 subtracts a state 378 of the third carry runway register 356 from the third portion 366 of the accumulation register 358.

Returning to FIG. 2, because each qubit of each carry runway register was initialized in a plus state at step 204, after applying the multiple subtraction operations to the accumulation register at step 206 the state of the accumulation register is approximately an eigenvector with eigenvalue 1 of an operation that would implement a "normal addition," i.e., adding 1 into the carry runway register and subtracting 1 from the high half of the accumulation register. The deviation of the approximation is exponentially small in the length of the carry runway register.

The system adds one or more input binary numbers into the accumulation register using piecewise addition (step 208). The system separates the input binary numbers into pieces corresponding to pieces of the accumulation register in between each carry runway register, and performs a respective addition operation for each corresponding piece of an input binary number to add the piece of the input binary number to a state of a respective accumulation register piece, where carries of the addition operations are added to states of respective carry runway registers. Addition operations for pieces of a same input binary number can be performed in parallel. In some implementations Cuccaro's ripple-carry adder operations can be used to perform the addition operations, as described in "A new quantum ripple-carry addition circuit," Cuccaro et. al., *arXiv preprint quant-ph*/0410184, 2004, the disclosure of which is incorporated herein by reference in its entirety.

Figure 4:
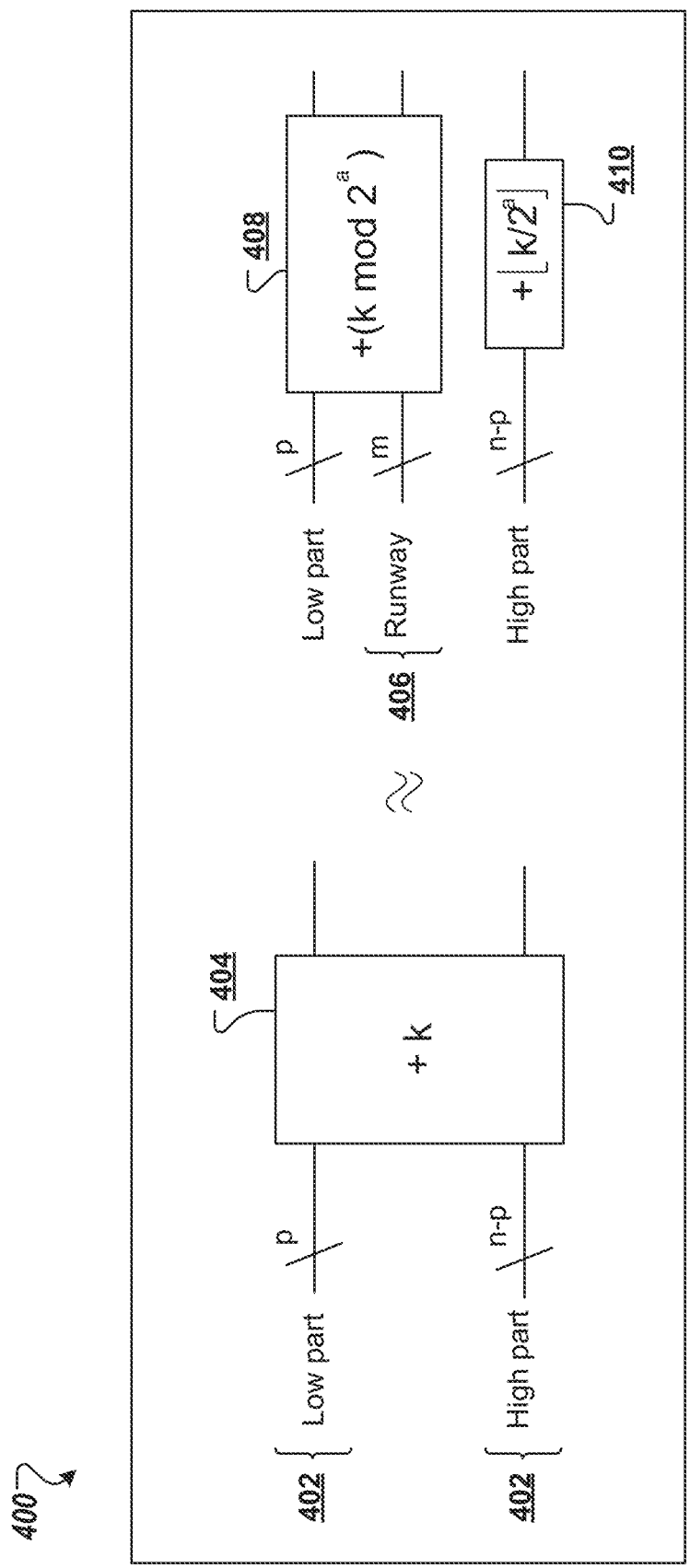
FIG. 4 shows an example circuit diagram for adding a number into an accumulation register using parallel piecewise additions enabled by an oblivious carry runway register.

After step 208, the combined state of the accumulation register and the one or more carry runway registers store a result of the addition of the one or more input binary numbers. FIG. 4 shows an example circuit diagram 400 for adding a number k 404 into an accumulation register 402 using parallel piecewise additions enabled by an oblivious carry runway register 406. The left hand side of example circuit diagram 400 shows the addition operation 404. The right hand side of example circuit diagram 400 shows how, after steps 202-208 of example process 200 are performed, the combined state of the low part of the accumulation register and the carry runway register has been incremented by k mod $2^a$ where a represents the bit position of the carry runway and the state of the high part of the accumulation register has been incremented by $\lfloor k/2^a \rfloor$.

To determine a result of the addition of the one or more input binary numbers, the system can first remove the one or more carry runway registers inserted at step 202 then measure the accumulation register (by measuring the qubits in the accumulation register) to determine a result of the addition of the one or more input binary numbers. Removing the one or more carry runway registers inserted at step 202 includes adding states of the one or more carry runway registers to the respective pieces of the accumulation register, e.g., by reversing the multiple subtraction operations described at step 206. By removing the one or more carry runway registers before measuring the accumulation register, the system can determine whether each qubit in each of the one or more carry runway registers were correctly initialized at step 304 or not, e.g., whether the qubits were successfully initialized in a plus state or whether the initialization was unsuccessful due to error or adversarial grounds.

Alternatively, the system can measure the accumulation register and the one or more carry runway registers then remove the measured states of the one or more carry runway registers from the measured state of the accumulation register using classical post processing to determine a result of the addition of the one or more input binary numbers.

The computational cost of performing k piecewise additions (terminated by the carry runways) into an accumulation register can be computed as follows. Assuming, without loss of generality, that Cuccaro's ripple-carry adder is used to perform addition operations, the measurement depth and Toffoli count of one addition into one piece is at most twice the length of the piece (where the ending piece length can be as large as 2s m and the rest of the pieces can have length s+m,) The k piecewise additions can be performed in parallel across pieces, so that the total measurement depth across all k additions is between 2·(s+m)·k and 2·(2s+m) k, while the total Toffoli count is 2~(n+m·r)·k.

The deviation of one addition operation with one carry runway using the presently described techniques is at most $2^{-m}$. Further, each addition has a deviation no larger than the number of runways times the deviation introduced by a single runway—at most $r·2^{-m}$. The deviation of the entire series of additions is at most the number of additions times the deviation of one addition—at most $k \cdot r \cdot 2^{-m}$. The trace distance between the final state of the register and the encoding of the correct output is at most $2\sqrt{k \cdot r \cdot 2^{-m}}$.

For example, consider a 4000 bit register with carry runways of length 40 at bit positions 1000, 2000, and 3000. If a million piecewise additions are performed into the register then the measurement depth is 2080 million, the Toffoli count is 8240 million, and the trace distance from the ideal output is at most 0.34%.

To perform modular addition instead of 2s complement addition, oblivious carry runways can be concatenated inside a coset representation of modular integers. In terms of computational costs, this is equivalent to introducing one additional runway at the end of the register. So the costs are very similar: a measurement depth between $2 \cdot (s+m) \cdot k$ and $2 \cdot (2s+m) \cdot k$, a Toffoli count of $n + m \cdot (r+1)$, and a trace distance of at most $2\sqrt{k \cdot (r+1) \cdot 2^{-m}}$.

Implementations of the digital and/or quantum subject matter and the digital functional operations and quantum operations described in this specification and appendix can be implemented in digital electronic circuitry, suitable quantum circuitry or, more generally, quantum computational systems, in tangibly-embodied digital and/or quantum computer software or firmware, in digital and/or quantum computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators. Quantum computation systems in general and quantum computers specifically may be realized or based on different quantum computational models and architectures. For example, the quantum computation system may be based on or described by models such as the quantum circuit model, one-way quantum computation, adiabatic quantum computation, holonomic quantum computation, analog quantum computation, digital quantum computation, or topological quantum computation.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum processors or both, or any other kind of central digital and/or quantum processing unit. Generally, a central digital and/or quantum processing unit will receive instructions and digital and/or quantum data from a read-only memory, a random access memory, or quantum systems suitable for transmitting quantum data, e.g. photons, or combinations thereof.

Elements of a digital and/or quantum computer include a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method for piecewise addition, the method comprising:
    applying one or more subtraction operations to an accumulation register, wherein each subtraction operation subtracts a state of a respective initialized carry runway register starting at a qubit position corresponding to where the respective initialized carry runway register begins in the accumulation register and ending at a qubit position prior to a next inserted carry runway or corresponding to a most significant bit of a first binary number; and
    adding one or more input binary numbers into the accumulation register using piecewise addition operations.

2. The method of claim 1, wherein adding the one or more input binary numbers into the accumulation register using piecewise addition comprises:
    separating the input binary numbers into pieces corresponding to portions of the accumulation register in between each carry runway register, and
    performing a respective addition operation for each corresponding piece of an input binary number to add the piece of the input binary number to a state of a respective accumulation register portion, wherein carries of the piecewise addition operations are added to states of respective carry runway registers.

3. The method of claim 1, further comprising inserting a predetermined number of carry runway registers into the accumulation register at evenly spaced intervals of the accumulation register.

4. The method of claim 1, wherein subtracting a state of a respective initialized carry runway register starting at a qubit position corresponding to where the respective initialized carry runway register begins in the accumulation register and ending at a qubit position prior to a next inserted carry runway or corresponding to a most significant bit of the first binary number comprises:
  subtracting a value encoded in the state of the carry runway register from a value of the state of a corresponding portion of the accumulation register, and
  updating the state of the portion of the accumulation register to encode a new value.

5. The method of claim 1, further comprising:
  adding states of the one or more carry runway registers to respective portions of the accumulation register; and
  measuring the accumulation register to determine a result of the addition of the one or more input binary numbers.

6. The method of claim 5, further comprising determining whether each qubit in each of the one or more carry runway registers was correctly initialized in a plus state.

7. The method of claim 1, further comprising:
  measuring the accumulation register and the one or more carry runway registers; and
  removing, by classical processing, the states of the one or more carry runway registers from the state of the accumulation register to determine a result of the piecewise addition.

8. The method of claim 1, wherein piecewise addition operations for pieces of a same input binary number are performed in parallel.

9. The method of claim 1, wherein: each qubit in the accumulation register represents a respective bit of a first binary number stored in little endian 2s complement integer format and each qubit in a respective carry runway register represents a respective binary number stored in little endian 2s complement integer format.

10. The method of claim 1, wherein the piecewise addition operations comprise 2s complement addition operations.

11. The method of claim 1, wherein the piecewise addition operations comprise modular addition operations.

12. An apparatus comprising:
  one or more classical computing processors; and
  quantum computing hardware in data communication with the one or more classical processors,
  wherein the apparatus is configured to perform operations comprising:
    applying one or more subtraction operations to an accumulation register, wherein each subtraction operation subtracts a state of a respective initialized carry runway register starting at a qubit position corresponding to where the respective initialized carry runway register begins in the accumulation register and ending at a qubit position prior to a next inserted carry runway or corresponding to a most significant bit of a first binary number; and
    adding one or more input binary numbers into the accumulation register using piecewise addition operations.

13. The apparatus of claim 12, wherein the quantum computing hardware comprises:
  an accumulation register comprising a first plurality of qubits;
  one or more carry runway registers, each carry runway register comprising a respective plurality of qubits; and
  a plurality of control devices configured to operate the first plurality of qubits and the respective pluralities of qubits.

14. The apparatus of claim 13, wherein the accumulation register comprises a first plurality of qubits with each qubit representing a respective bit of a first binary number, and wherein each carry runway register comprises multiple qubits representing a respective binary number.

15. The apparatus of claim 12, wherein adding the one or more input binary numbers into the accumulation register using piecewise addition comprises:
  separating the input binary numbers into pieces corresponding to portions of the accumulation register in between each carry runway register, and
  performing a respective addition operation for each corresponding piece of an input binary number to add the piece of the input binary number to a state of a respective accumulation register portion, wherein carries of the piecewise addition operations are added to states of respective carry runway registers.

16. The apparatus of claim 12, wherein subtracting a state of a respective initialized carry runway register starting at a qubit position corresponding to where the respective initialized carry runway register begins in the accumulation register and ending at a qubit position prior to a next inserted carry runway or corresponding to a most significant bit of the first binary number comprises:
  subtracting a value encoded in the state of the carry runway register from a value of the state of a corresponding portion of the accumulation register, and
  updating the state of the portion of the accumulation register to encode a new value.

17. The apparatus of claim 12, wherein the operations further comprise:
  adding states of the one or more carry runway registers to respective portions of the accumulation register; and
  measuring the accumulation register to determine a result of the addition of the one or more input binary numbers.

18. The apparatus of claim 17, wherein the operations further comprise determining whether each qubit in each of the one or more carry runway registers was correctly initialized in a plus state.

19. The apparatus of claim 12, wherein the operations further comprise:
  measuring the accumulation register and the one or more carry runway registers; and
  removing, by classical processing, the states of the one or more carry runway registers from the state of the accumulation register to determine a result of the piecewise addition.

20. The apparatus of claim 12, wherein piecewise addition operations for pieces of a same input binary number are performed in parallel.

* * * * *